(12) United States Patent
Kim et al.

(10) Patent No.: US 8,546,938 B2
(45) Date of Patent: Oct. 1, 2013

(54) STACKED PACKAGE INCLUDING SPACERS AND METHOD OF MANUFACTURING THE SAME

(75) Inventors: Sang-Geun Kim, Cheonan-si (KR); Dong-Chul Han, Cheonan-si (KR); Seok Goh, Cheonan-si (KR); Jeong-Hoon Kim, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 8 days.

(21) Appl. No.: 13/311,681

(22) Filed: Dec. 6, 2011

(65) Prior Publication Data

US 2012/0205795 A1 Aug. 16, 2012

(30) Foreign Application Priority Data

Feb. 15, 2011 (KR) ........................ 10-2011-0013128

(51) Int. Cl.
*H01L 23/34* (2006.01)

(52) U.S. Cl.
USPC ............................ 257/723; 257/724; 257/725

(58) Field of Classification Search
USPC ............ 257/723, 724, 725, E23.17, E23.174, 257/E23.178
See application file for complete search history.

(56) References Cited

U.S. PATENT DOCUMENTS

| | | | |
|---|---|---|---|
| 5,579,207 A * | 11/1996 | Hayden et al. | 361/790 |
| 5,608,265 A * | 3/1997 | Kitano et al. | 257/738 |
| 5,883,426 A * | 3/1999 | Tokuno et al. | 257/686 |
| 6,489,676 B2 * | 12/2002 | Taniguchi et al. | 257/698 |
| 6,740,964 B2 * | 5/2004 | Sasaki | 257/687 |
| 6,798,057 B2 * | 9/2004 | Bolkin et al. | 257/686 |
| 6,828,665 B2 * | 12/2004 | Pu et al. | 257/686 |
| 6,847,109 B2 * | 1/2005 | Shim | 257/697 |
| 6,861,288 B2 * | 3/2005 | Shim et al. | 438/109 |
| 7,029,953 B2 * | 4/2006 | Sasaki | 438/126 |
| 7,288,835 B2 * | 10/2007 | Yim et al. | 257/685 |
| 7,345,361 B2 * | 3/2008 | Mallik et al. | 257/686 |
| 7,354,800 B2 * | 4/2008 | Carson | 438/109 |
| 7,372,141 B2 * | 5/2008 | Karnezos et al. | 257/686 |
| 7,429,786 B2 * | 9/2008 | Karnezos et al. | 257/686 |
| 7,429,787 B2 * | 9/2008 | Karnezos et al. | 257/686 |
| 7,642,133 B2 * | 1/2010 | Wu et al. | 438/109 |
| 7,723,839 B2 * | 5/2010 | Yano et al. | 257/700 |
| 7,777,351 B1 * | 8/2010 | Berry et al. | 257/778 |
| 7,838,334 B2 * | 11/2010 | Yu et al. | 438/107 |
| 2004/0126927 A1 * | 7/2004 | Lin et al. | 438/107 |
| 2005/0121764 A1 * | 6/2005 | Mallik et al. | 257/686 |
| 2006/0170112 A1 * | 8/2006 | Tanaka et al. | 257/777 |
| 2006/0220210 A1 * | 10/2006 | Karnezos et al. | 257/686 |
| 2006/0244117 A1 * | 11/2006 | Karnezos et al. | 257/678 |
| 2008/0017968 A1 * | 1/2008 | Choi et al. | 257/686 |
| 2008/0073769 A1 * | 3/2008 | Wu et al. | 257/686 |

(Continued)

FOREIGN PATENT DOCUMENTS

| | | | |
|---|---|---|---|
| KR | 10-2009-0022749 A | | 3/2009 |
| KR | 10-2009-0059503 A | | 6/2009 |

*Primary Examiner* — Ngan Ngo
(74) *Attorney, Agent, or Firm* — Sughrue Mion, PLLC (57) ABSTRACT

A stacked package and method of manufacture are provided. The stacked package may include a first semiconductor package, a second semiconductor package, plugs and spacers. The second semiconductor package may be stacked on the first semiconductor package. The plugs may electrically connect the first semiconductor to the second semiconductor package. The spacer may be interposed between the first semiconductor package and the second semiconductor package to form a gap between the first semiconductor package and the second semiconductor package, thereby preventing an electrical short between the plugs.

19 Claims, 10 Drawing Sheets

(56) References Cited

U.S. PATENT DOCUMENTS

| | | |
|---|---|---|
| 2009/0057918 A1 | 3/2009 | Kim |
| 2009/0146284 A1 | 6/2009 | Kim et al. |
| 2010/0032821 A1* | 2/2010 | Pagaila et al. ............... 257/686 |
| 2010/0171205 A1* | 7/2010 | Chen et al. .................. 257/686 |
| 2010/0171206 A1* | 7/2010 | Chu et al. .................... 257/686 |
| 2010/0171207 A1 | 7/2010 | Shen et al. |

* cited by examiner

STACKED PACKAGE INCLUDING SPACERS AND METHOD OF MANUFACTURING THE SAME

CROSS-REFERENCE TO RELATED APPLICATION

This application claims priority from Korean Patent Application No. 2011-13128,filed on Feb. 15, 2011 in the Korean Intellectual Property Office, the contents of which are herein incorporated by reference in their entirety.

BACKGROUND

1. Field

Article of manufacture and methods consistent with exemplary embodiments relate to a stacked package and a method of manufacturing the same and, more particularly, to a stacked package including sequentially stacked semiconductor packages, and a method of manufacturing the stacked package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages. Further, in order to increase storage capacity of the semiconductor package, a stacked package including sequentially stacked semiconductor packages may be used.

The stacked package may include several semiconductor packages and plugs, in which the semiconductor packages are stacked on one another and the plugs provide electrical connections between the packages.

In order to attach the plugs to the packages, heat may be applied to the plugs. While applying the heat to the plugs, the plugs may become liquefied and compressed such that an electrical short may be generated between adjacent plugs.

SUMMARY

One or more exemplary embodiments provide a stacked package capable of preventing an electrical short between plugs.

One or more exemplary embodiments also provide a method of manufacturing the above-mentioned stacked package.

According to an aspect of an exemplary embodiment, there is provided a stacked package. The stacked package may include a first semiconductor package, a second semiconductor package, a plurality of plugs and a plurality of spacers. The second semiconductor package may be stacked on the first semiconductor package. The plugs may electrically connect the first semiconductor to the second semiconductor package. The spacers may be interposed between the first semiconductor package and the second semiconductor package to form a gap between the first semiconductor package and the second semiconductor package, thereby preventing an electrical short between the plugs.

The spacers may be positioned at corners between the first semiconductor package and the second semiconductor package.

The spacers may be configured to individually surround each of the plugs.

The spacers may be configured to have a substantially same thickness.

The spacers may have a rounded upper configured to make point contact with the second semiconductor package.

The spacer may have a first surface making contact with the second semiconductor package, and a second surface making contact with the first semiconductor package. The first surface may have an area smaller than that of the second surface.

The spacers may have a gradually decreasing cross-sectional area in a direction from the first surface toward the second surface.

The spacer may be provided on the first semiconductor package.

The first semiconductor package may include a first package substrate, a first semiconductor chip arranged on a surface of the first package substrate and electrically connected with the first package substrate, and a first molding member formed on the surface of the first package substrate. The first molding member may comprise spacers and plug holes configured to receive the plugs.

The first semiconductor package may further include conductive bumps interposed between the first package substrate and the first semiconductor chip to electrically connect the first package substrate with the first semiconductor chip.

The spacers may be provided to the second semiconductor package.

The second semiconductor package may include a second package substrate stacked on the first semiconductor package, a second semiconductor chip arranged on a surface facing away from the first semiconductor package when the second semiconductor package is stacked on the first semiconductor package and electrically connected with the second package substrate, and a second molding member formed on the surface of the first package substrate. The second package substrate may be electrically connected to the plugs. The second package substrate may have the spacers.

According to an aspect of another exemplary embodiment, there is provided a method of manufacturing a stacked package. The method comprises preparing a first package substrate; arranging plugs on the first package substrate; forming spacers on the first package substrate; and stacking a second semiconductor package on the first package substrate, the second semiconductor package electrically connected with the first package substrate via the plugs, and the spacers interposed between the first package substrate and the second semiconductor package to form a gap between the first package substrate and the second semiconductor package.

The preparing the first package substrate may comprise arranging a first semiconductor chip on a surface of the first package substrate.

The forming the spacers may comprise forming a first molding member having the spacers on the surface of the first package substrate.

The method may further comprise, after forming the first molding member, forming plug holes in the first molding member.

The plug holes may be formed by partially removing a surface of the first molding member to expose the plugs using a drill process or an etching process.

BRIEF DESCRIPTION OF THE DRAWINGS

The above and/or other aspects will be more clearly understood from the following detailed description of exemplary embodiments taken in conjunction with the accompanying drawings, in which.

DETAILED DESCRIPTION

Various exemplary embodiments will be described more fully hereinafter with reference to the accompanying drawings. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 1:
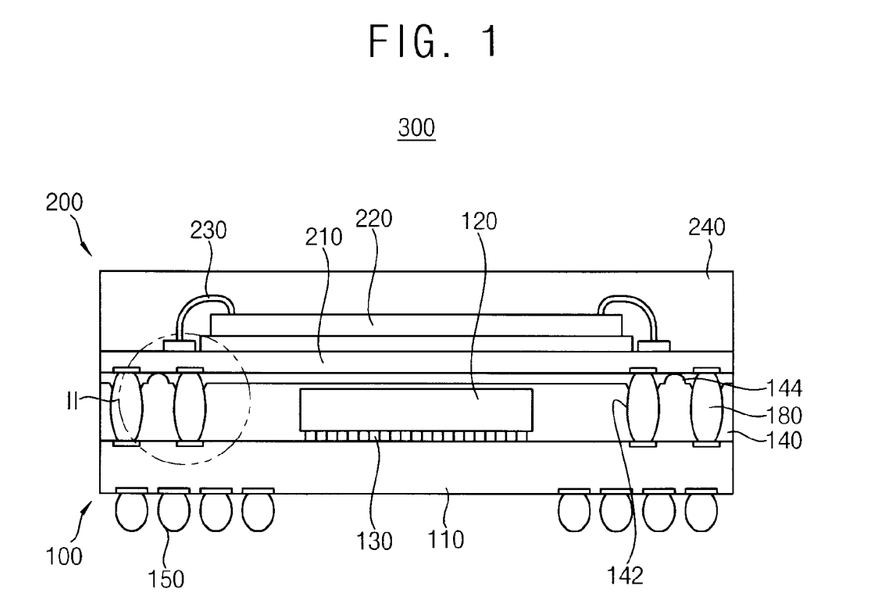
FIG. 1 is a cross-sectional view illustrating a stacked package in accordance with an exemplary embodiment.
Figure 2:
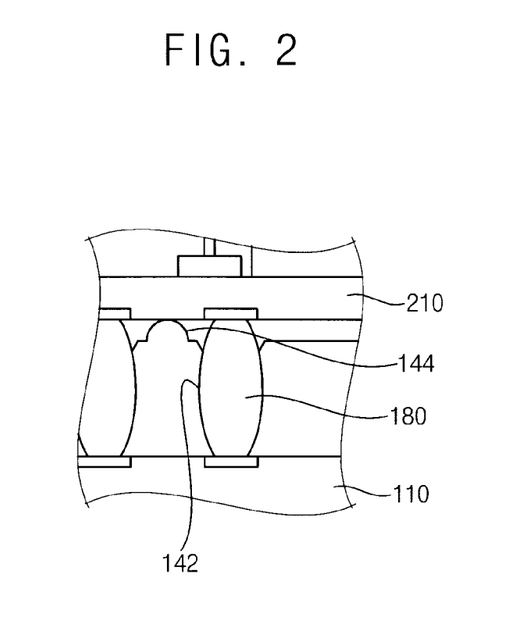
FIG. 2 is an enlarged cross-sectional view of a portion "II" in FIG. 1.
Figure 3:
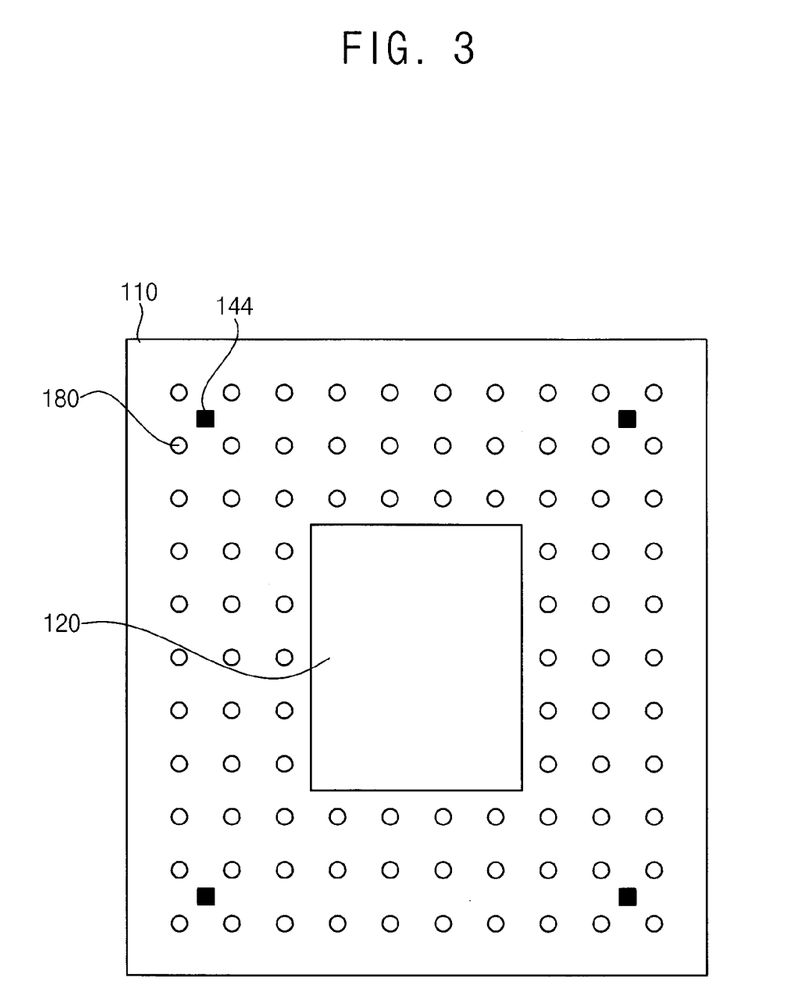
FIG. 3 is a plan view illustrating a first semiconductor package of the stacked package in FIG. 1.

FIG. 1 is a cross-sectional view illustrating a stacked package in accordance with some exemplary embodiments, FIG. 2 is an enlarged cross-sectional view of a portion "II" in FIG. 1, and FIG. 3 is a plan view illustrating a first semiconductor package of the stacked package in FIG. 1.

Referring to FIGS. 1 to 3, a stacked package 300 of this exemplary embodiment may include a first semiconductor package 100, plugs 180 and a second semiconductor package 200.

The first semiconductor package 100 may include a first package substrate 110, a first semiconductor chip 120, conductive bumps 130, a first molding member 140 and external terminals 150.

In some exemplary embodiments, the first package substrate 110 may include an insulating substrate (not shown) and a circuit pattern (not shown). The circuit pattern may be built in the insulating substrate. The circuit pattern may have an upper end exposed through an upper surface of the insulating substrate, and a lower end exposed through a lower surface of the insulating substrate.

The first semiconductor chip 120 may be arranged on an upper central surface of the first package substrate 110. In some exemplary embodiments, the first semiconductor chip 120 may have pads (not shown). The pads may be arranged on a lower surface of the first semiconductor chip 120. Thus, the pads may be oriented toward the first package substrate 110. The first semiconductor chip 120 may include a logic chip.

The conductive bumps 130 may be interposed between the first semiconductor chip 120 and the first package substrate 110 to electrically connect the pads of the first semiconductor chip 120 with the circuit pattern of the first package substrate 110. In some exemplary embodiments, the conductive bumps 130 may include solder bumps.

The first molding member 140 may be formed on the upper surface of the first package substrate 110 to surround side surfaces of the first semiconductor chip 120. Thus, the first semiconductor chip 120 may have an exposed upper surface. Alternatively, the first molding member 140 may be configured to cover the upper surface of the first semiconductor chip 120. The first molding member 140 may have plug holes 142 and spacers 144. In some exemplary embodiments, the first molding member 140 may include an epoxy molding compound (EMC).

In some exemplary embodiments, the plug holes 142 may be vertically formed through an edge portion of the first molding member 140. The plugs 180 may be received in the plug holes 142. Thus, upper ends of the plugs 180 in the plug holes 142 may be exposed. In contrast, lower ends of the plugs 180 in the plug holes 142 may contact with the upper surface of the first package substrate 110. The lower ends of the plugs 180 in the plug holes 142 may be electrically connected to the circuit pattern of the first package substrate 110.

The spacers 144 may be formed on an upper surface of the first molding member 140. In some exemplary embodiments, the spacers 144 may be a part of the first molding member 140 protruded from the upper surface of the first molding member 140. Thus, the spacers 144 may be formed together with formation of the first molding member 140. Alternatively, the spacers 144 may be formed by a separate process different from a process for forming the first molding member 140.

In some exemplary embodiments, the spacers 144 may have a function as to form a gap between the first semiconductor package 100 and the second semiconductor package 200. In such as case, when the second semiconductor package 200 is attached to the first semiconductor package 100, the second semiconductor package 200 may make contact with the spacers 144, so that the second semiconductor package 200 does not compress the plugs 180 in the plug holes 142. As a result, during a reflow process for attaching the plug 180 to the second semiconductor package 200, the spacers 144 may prevent an electrical short between adjacent liquefied plugs 180.

The liquefied plugs 180 may flow between the first molding member 140 and the second semiconductor package 200 by a capillary phenomenon. The capillary phenomenon tends to increase in proportion to an interface area between the first molding member 140 and the second semiconductor package 200. In some cases, it is advantageous to prevent the capillary phenomenon. Accordingly, in some exemplary embodiments, each of the spacers 144 may include a lower surface having a lower area, and an upper surface having an upper area smaller than the lower area. In some exemplary embodiments, each of the spacers 144 may have a gradually decreased area in an upward direction.

In some cases, when the second semiconductor package 200 that makes contact with the spacers 144 leans, the plugs 180 may be partially disconnected with the second semiconductor package 200. In some cases, it is advantageous to prevent the disconnection between plugs 180 and the second semiconductor package 200. Accordingly, in some exemplary embodiments, the spacers 144 may have substantially the same thickness.

In some exemplary embodiments, four spacers 144 may be positioned at four corners of the first molding member 140. Thus, the spacers 144 having a uniform thickness may form a uniform gap between the first semiconductor package 100 and the second semiconductor package 200.

The external terminals 150 may be mounted on the lower surface of the first package substrate 110. The external terminals 150 may electrically make contact with the circuit pattern exposed through the lower surface of the first package substrate 110. Thus, the external terminals 150 may be electrically connected with the plugs 180. In some exemplary embodiments, the external terminals 150 may include solder balls.

The second semiconductor package 200 may include a second package substrate 210, a second semiconductor chip 220, conductive wires 230 and a second molding member 240.

In some exemplary embodiments, the second package substrate 210 may be arranged on the upper surface of the first molding member 140. Thus, a lower surface of the second package substrate 210 may make contact with the spacers 144. However, in some cases, the lower surface of the second package substrate 210 may not make contact with the plugs 180. In some exemplary embodiments, the second package substrate 210 may include an insulating substrate and a circuit pattern built in the insulating substrate. The circuit pattern may be exposed through an upper surface and a lower surface of the insulating substrate.

The second semiconductor chip 220 may be arranged on an upper central surface of the second package substrate 210. The second semiconductor chip 220 may have pads (not shown). The pads may be arranged on an upper edge surface of the second semiconductor chip 220. In some exemplary embodiments, the second semiconductor chip 220 may include a memory chip.

The conductive wires 230 may be electrically connected between the pads of the second semiconductor chip 220 and the circuit pattern of the second package substrate 210. In some exemplary embodiments, the conductive wires 230 may include a metal wire such as a gold wire.

The second molding member 240 may be formed on the upper surface of the second package substrate 210 to cover the second semiconductor chip 220 and the conductive wires 230. The second molding member 240 may include an EMC.

According to this exemplary embodiment, the spacers located at the four corners of the first molding member may prevent a contact between the second semiconductor package and the plugs. Thus, an electrical short between the adjacent liquefied plugs may be prevented.

FIGS. 4 to 10 are cross-sectional views illustrating a method of manufacturing the stacked package in FIG. 1.

Figure 4:
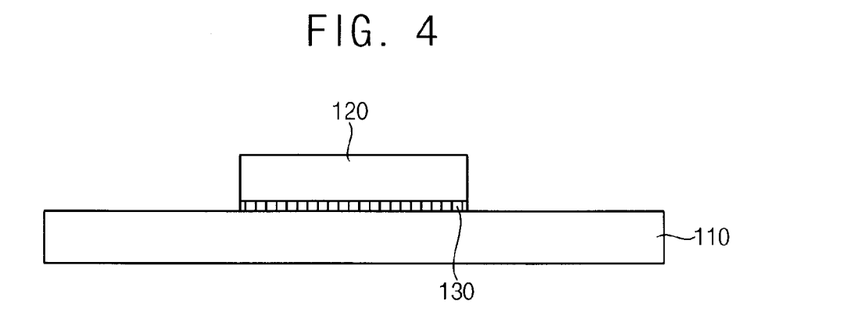
FIGS. 4 to 10 are cross-sectional views illustrating a method of manufacturing the stacked package in FIG. 1.

Referring to FIG. 4, the conductive bumps 130 may be attached to the upper surface of the first package substrate 110. The first semiconductor chip 120 may be attached to the conductive bumps 130. A reflow process may be performed on the conductive bumps 130 to electrically connect the first semiconductor chip 120 with the first package substrate 110 via the conductive bumps 130.

Figure 5:
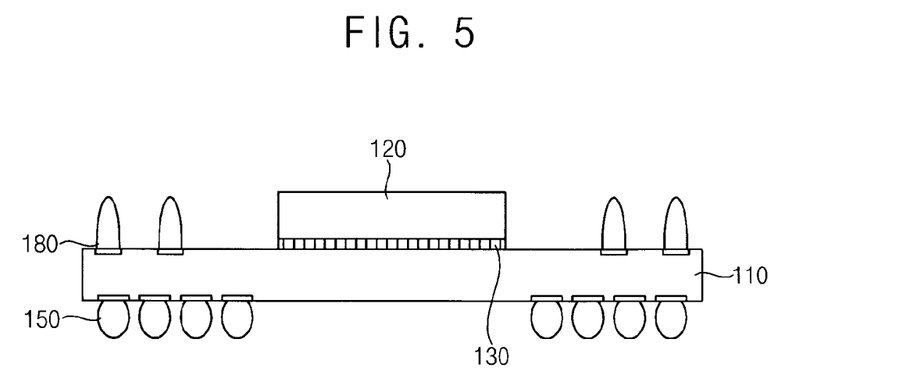

Referring to FIG. 5, the plugs 180 may be attached to the upper surface of the first package substrate 110. The external terminals 150 may be mounted on the lower surface of the first package substrate 110.

Figure 6:
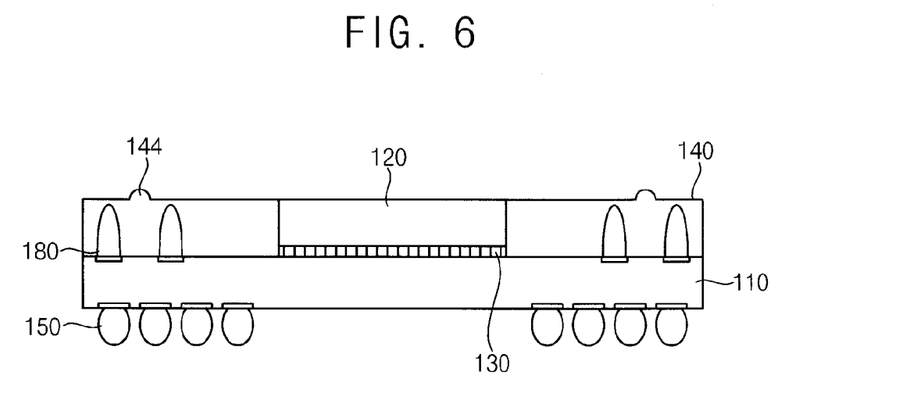

Referring to FIG. 6, the first molding member 140 may be formed on the upper surface of the first package substrate 110 to cover the plugs 180 and the first semiconductor chip 120. In some exemplary embodiments, the first molding member 140 may be configured to surround the side surfaces of the first semiconductor chip 120. Thus, the upper surface of the first semiconductor chip 120 may be exposed.

In some exemplary embodiments, the first molding member 140 may have the four spacers 144, as shown in FIG. 6. The spacers 144 may be formed on the corners of the upper surface of the first molding member 140. The spacers 144 may be positioned so as not to overlap with the plugs 180.

Figure 7:
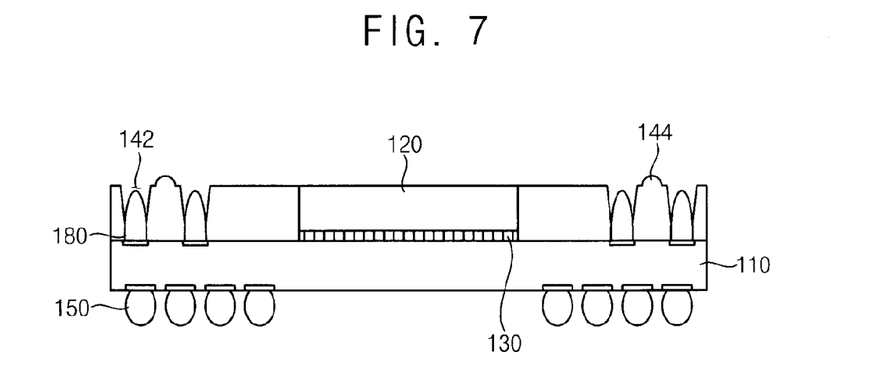

Referring to FIG. 7, the upper surface of the first molding member 140 may be partially removed to form the plug holes 142 configured to expose the plugs 180, thereby completing the first semiconductor package 100. In some exemplary embodiments, the upper surface of the first molding member 140 may be removed by using a drill process, an etch process, etc.

Figure 8:
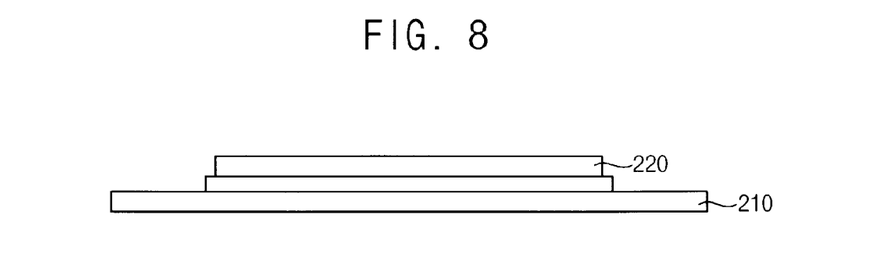

Referring to FIG. 8, the second semiconductor chip 220 may be attached to the upper central surface of the second package substrate 210.

Figure 9:
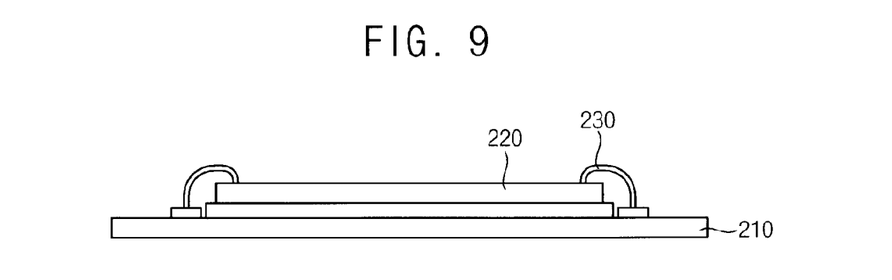

Referring to FIG. 9, the conductive wires 230 may be connected between the pads of the second semiconductor chip 220 and the circuit pattern of the second package substrate 210.

Figure 10:
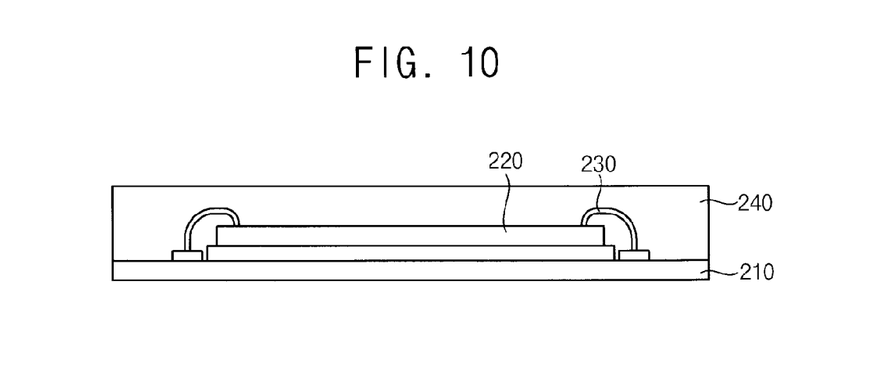

Referring to FIG. 10, the second molding member 240 may be formed on the upper surface of the second package substrate 210 to cover the second semiconductor chip 220 and the conductive wires 230, thereby completing the second semiconductor package 200.

The second semiconductor package 200 may be arranged on the first semiconductor package 100. The lower surface of the second package substrate 210 may make contact with the spacers 144, such that the lower surface of the second package substrate 210 does not make contact with the plugs 180.

The reflow process may be performed on the plugs 180 and the external terminals 150. The external terminals 150 may be firmly fixed to the lower surface of the first package substrate 110.

In some cases, when the solid plugs 180 are converted into liquefied plugs by the heat generated during the reflow process, the liquefied plugs 180 may be connected with each other. However, according to the exemplary embodiment, because the spacers 144 may form the gap between the first molding member 140 and the second package substrate 210, the liquefied plug 180 may be prevented from flowing into the adjacent liquefied plug 180, so that an electrical short between the liquefied plugs 180 may be prevented. Further, because the upper surface of the spacers 144 may have an upper area smaller than a lower area of the lower surface of the spacers 144, the capillary phenomenon, by which the liquefied plug 180 flows into the adjacent liquefied plug 180 through an interface between the spacer 144 and the second package substrate 210, may be suppressed. As a result, the electrical short between the adjacent plugs 180 may be prevented.

When the liquefied plugs 180 may be cooled, the solid plugs 180 may be firmly secured to the first package substrate 110 and the second package substrate 210. Thus, the stacked package 300 in FIG. 1 including the first semiconductor package 100 and the second semiconductor package 200 connected with each other via the plugs 180 may be completed.

Figure 11:
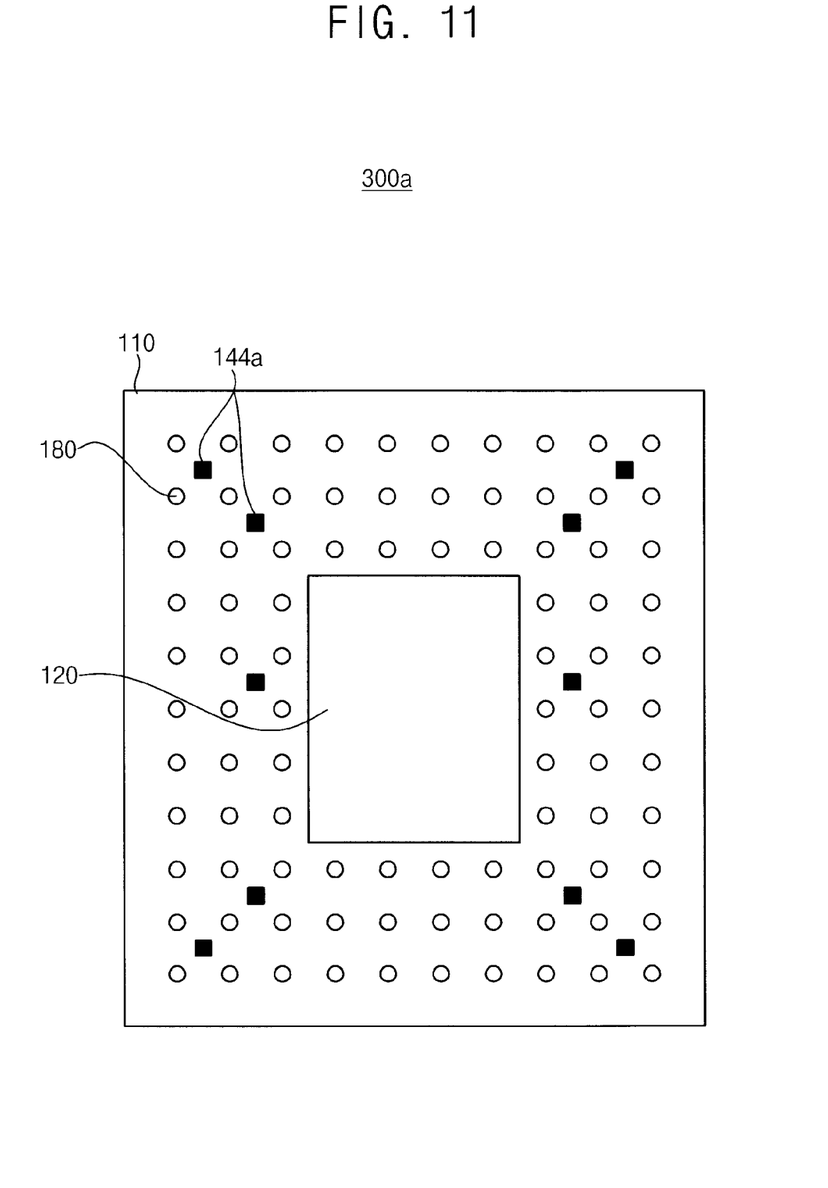
FIG. 11 is a plan view illustrating a first semiconductor package of a stacked package in accordance with another exemplary embodiment.

FIG. 11 is a plan view illustrating a first semiconductor package of a stacked package in accordance with another exemplary embodiment.

The stacked package 300a of this exemplary embodiment may include elements substantially the same as those of the stacked package 300 in FIG. 1 except for the spacers. Thus, the same reference numerals may refer to the same elements, and any further illustrations with respect to the same elements are omitted herein for brevity.

Referring to FIG. 11, the stacked package 300a in accordance with this exemplary embodiment may include eight spacers 144a at the corners of the first molding member 140, and two spacers 144a at a central surface of the first molding member 140. A pair (i.e., two) of the spacers 144a may be positioned at each of the corners of the first molding member 140. Thus, the spacers 144a may more firmly support the second semiconductor package 200 compared to the spacers 144 in FIG. 1.

Figure 12:
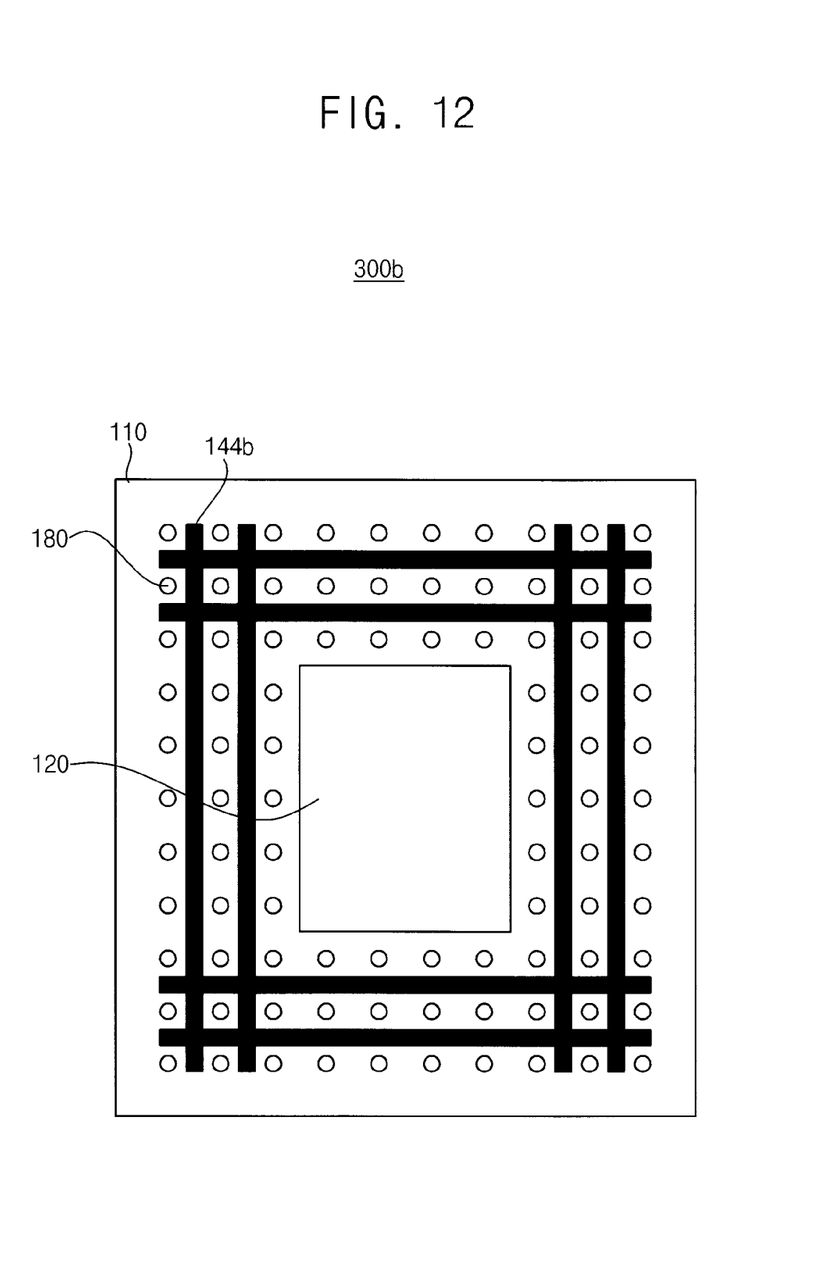
FIG. 12 is a plan view illustrating a first semiconductor package of a stacked package in accordance with another exemplary embodiment.

FIG. 12 is a plan view illustrating a first semiconductor package of a stacked package in accordance with another exemplary embodiment.

The stacked package 300b of this exemplary embodiment may include elements substantially the same as those of the stacked package 300 in FIG. 1 except for the spacers. Thus, the same reference numerals may refer to the same elements, and any further illustrations with respect to the same elements are omitted herein for brevity.

Referring to FIG. 12, the stacked package 300b in accordance with this exemplary embodiment may include stripe-shaped spacers 144b extending on an upper edge surface of the first molding member 140 in two rows along lengthwise and breadthwise directions. The stripe-shaped spacers 144b may intersect with each other at the corners of the first molding member 140. Thus, the stripe-shaped spacers 144b may more firmly support the second semiconductor package 200 compared to the spacers 144 in FIG. 1 and the spacers 144a in FIG. 11.

Figure 13:
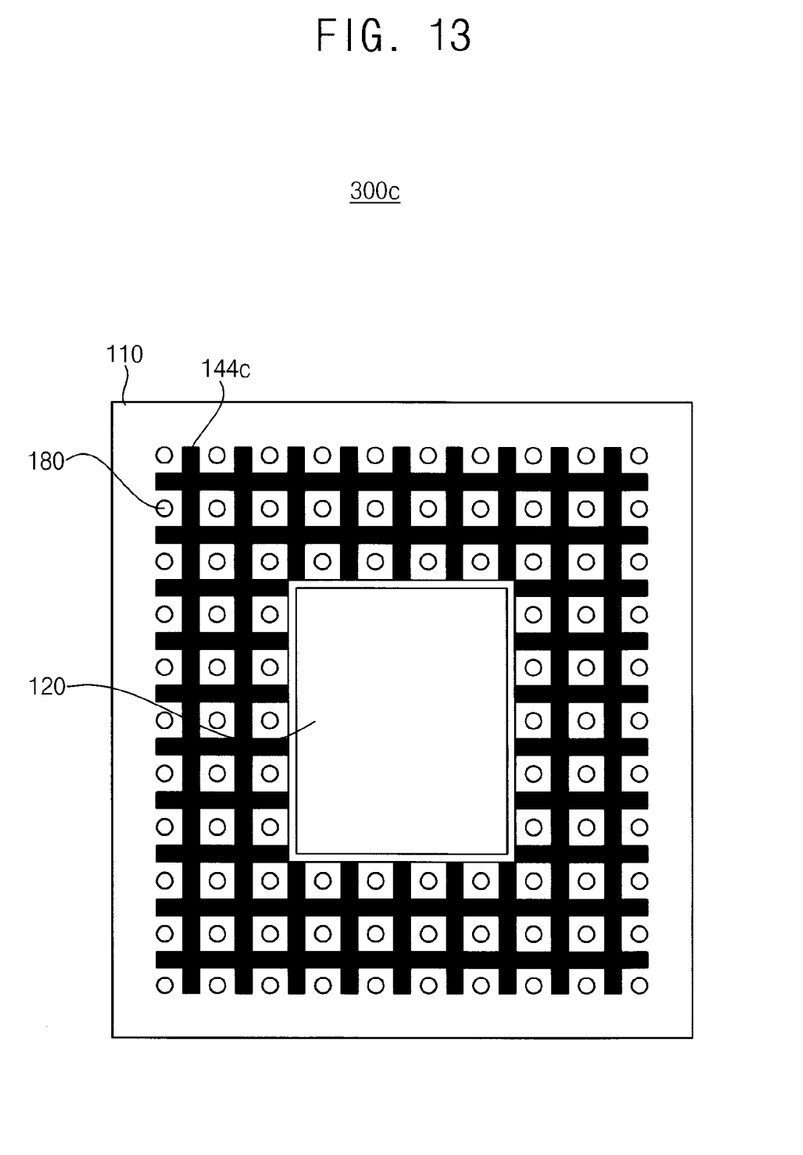
FIG. 13 is a plan view illustrating a first semiconductor package of a stacked package in accordance with another exemplary embodiment.

FIG. 13 is a plan view illustrating a first semiconductor package of a stacked package in accordance with another exemplary embodiment.

The stacked package 300c of this exemplary embodiment may include elements substantially the same as those of the stacked package 300 in FIG. 1 except for the spacers. Thus, the same reference numerals may refer to the same elements, and any further illustrations with respect to the same elements may be omitted herein for brevity.

Referring to FIG. 13, the stacked package 300c in accordance with this exemplary embodiment may include a spacer 144c configured to individually surround the plugs 180 exposed through the upper surface of the first molding member 140. Thus, the spacer 144c may more firmly support the second semiconductor package 200 compared to the spacers 144 in FIG. 1, the spacers 144a in FIG. 11 and the spacers 144b in FIG. 12. Further, because the spacer 144c may individually surround each of the plugs 180, if heat is applied and the plugs 180 liquefy, the flow of the plug 180 toward the adjacent plug 180 may be suppressed.

Figure 14:
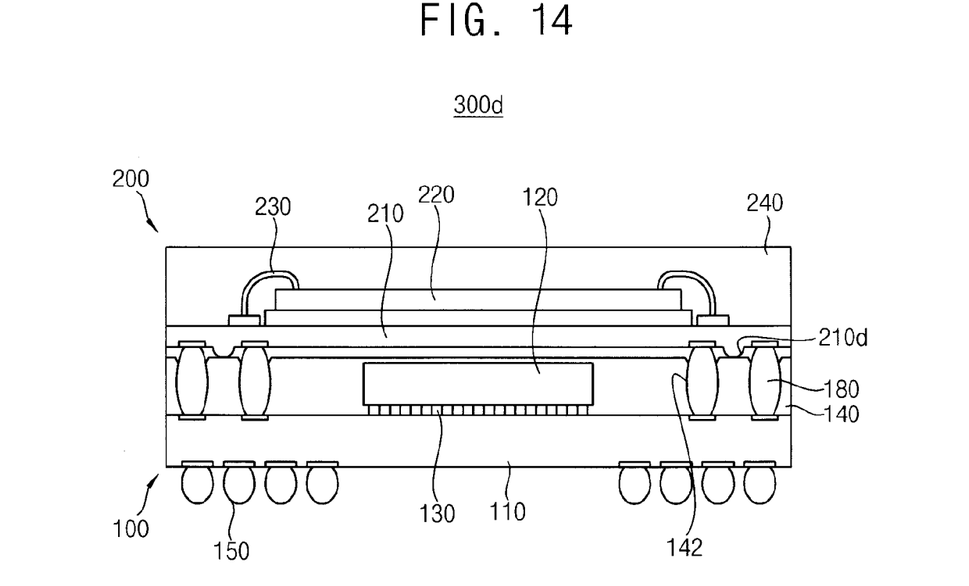
FIG. 14 is a plan view illustrating a stacked package in accordance with another exemplary embodiment.

FIG. 14 is a plan view illustrating a stacked package in accordance with another exemplary embodiment.

The stacked package 300d of this exemplary embodiment may include elements substantially the same as those of the stacked package 300 in FIG. 1 except for the spacers. Thus, the same reference numerals may refer to the same elements, and any further illustrations with respect to the same elements are omitted herein for brevity.

Referring to FIG. 14, the stacked package 300d in accordance with this exemplary embodiment may include spacers 210d formed on the lower surface of the second package substrate 210. The spacers 210d may be formed together with the formation of the second package substrate 210. Alternatively, the spacers 210d may be formed by a separate process different from a process for forming the second package substrate 210.

The spacers 210d of the second package substrate 210 may make contact with the upper surface of the first molding member 140 to prevent a contact between the second package substrate 210 and the plugs 180.

In some exemplary embodiments, the spacers 210d may have functions substantially the same as those of the spacers 144 in FIG. 1. Thus, any further illustrations with respect to the spacers 210d are omitted herein for brevity. Further, the spacers 210d may have a shape substantially the same as that of the spacers 144 in FIG. 3, the spacers 144a in FIG. 11, the spacers 144b in FIG. 12 or the spacers 144c in FIG. 13. One of ordinary skill in the art will also appreciate that one or more spacers may be formed both on the second package substrate 210 and the first package substrate 110. In such a case, it is advantageous if the one or more spacers on the second packages substrate 210 are formed in locations different than the one or more spacers on the first package substrate 110 so as not to increase the space between the packages so much that the packages cannot be electrically connected together.

FIGS. 15 to 21 are cross-sectional views illustrating a method of manufacturing the stacked package in FIG. 14.

Figure 15:
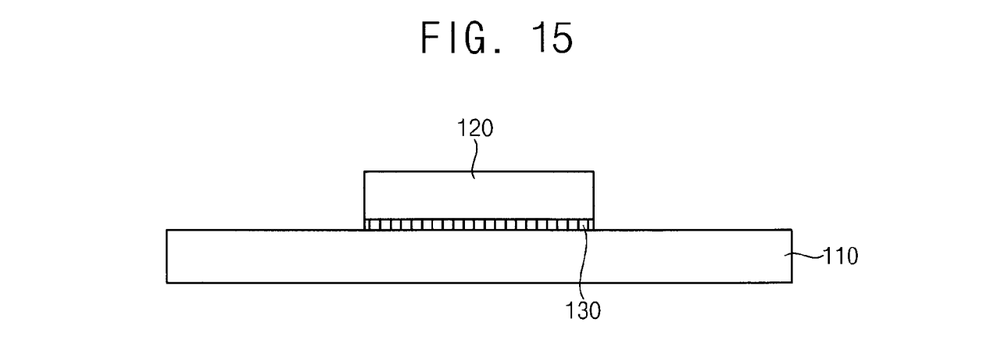
FIGS. 15 to 21 are cross-sectional views illustrating a method of manufacturing the stacked package in FIG. 14.

Referring to FIG. 15, the conductive bumps 130 may be attached to the upper surface of the first package substrate 110. The first semiconductor chip 120 may be attached to the conductive bumps 130. The reflow process may be performed on the conductive bumps 130 to electrically connect the first semiconductor chip 120 with the first package substrate 110 via the conductive bumps 130.

Figure 16:
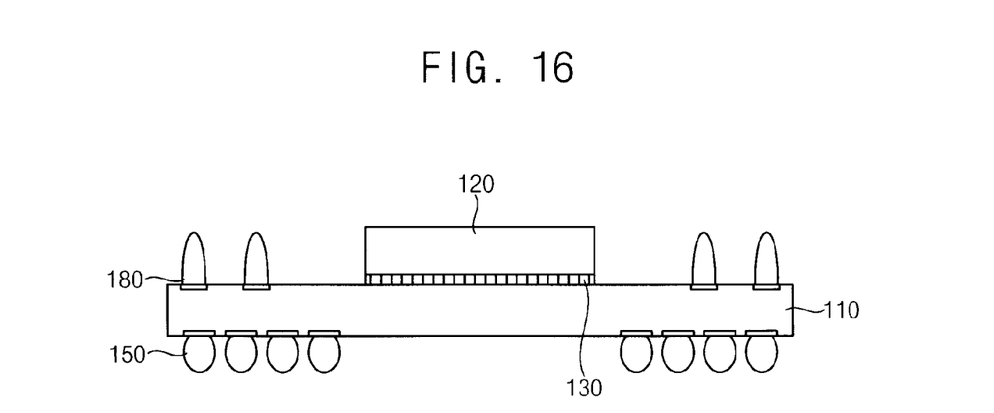

Referring to FIG. 16, the plugs 180 may be attached to the upper surface of the first package substrate 110. The external terminals 150 may be mounted on the lower surface of the first package substrate 110.

Figure 17:
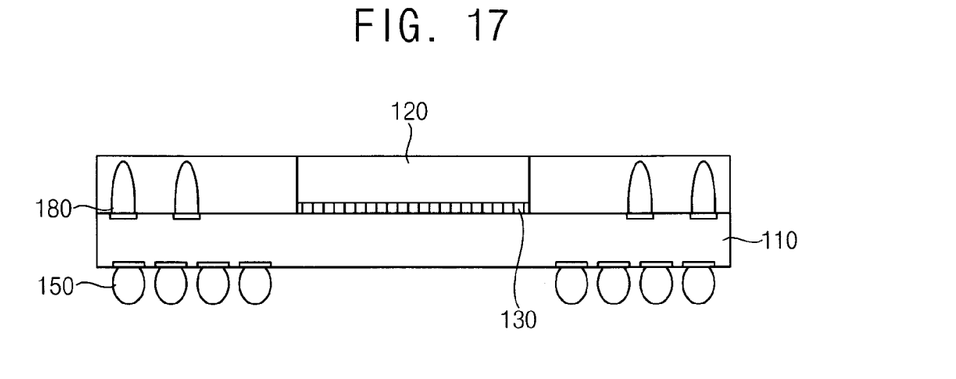

Referring to FIG. 17, the first molding member 140 may be formed on the upper surface of the first package substrate 110 to cover the plugs 180 and the first semiconductor chip 120. In some exemplary embodiments, the first molding member 140 may surround the side surfaces of the first semiconductor chip 120. Thus, the upper surface of the first semiconductor chip 120 may be exposed.

Figure 18:
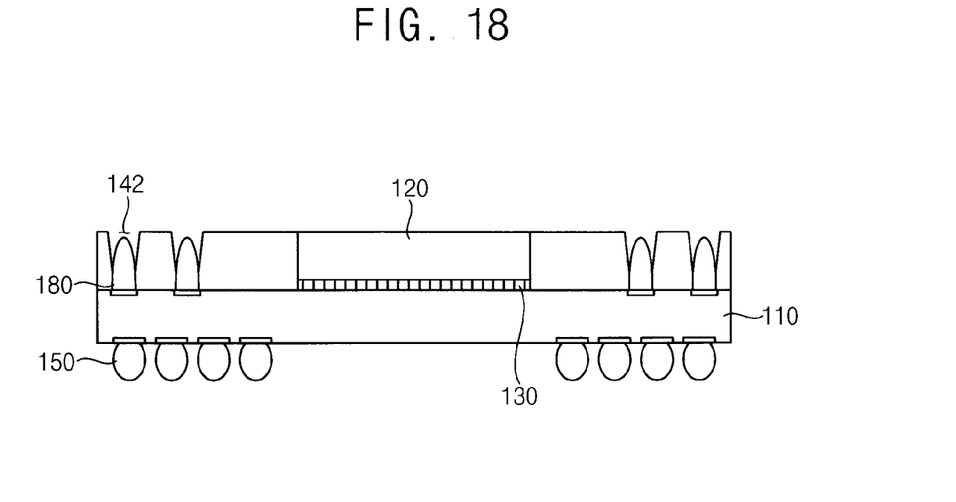

Referring to FIG. 18, the upper surface of the first molding member 140 may be partially removed to form the plug holes 142 configured to expose the plugs 180, thereby completing the first semiconductor package 100. In some exemplary embodiments, the upper surface of the first molding member 140 may be removed by a drill process, an etch process, etc.

Figure 19:
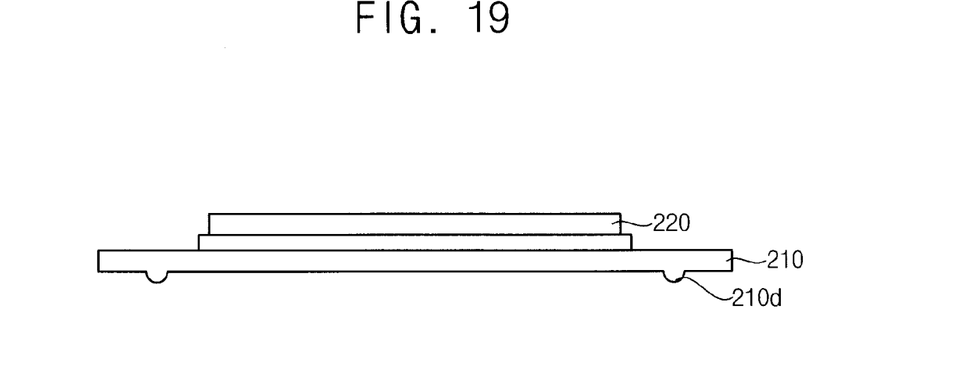

Referring to FIG. 19, the second semiconductor chip 220 may be attached to the upper central surface of the second package substrate 210. In some exemplary embodiments, the spacers 210d may be formed on the lower surface of the second package substrate 210.

Figure 20:
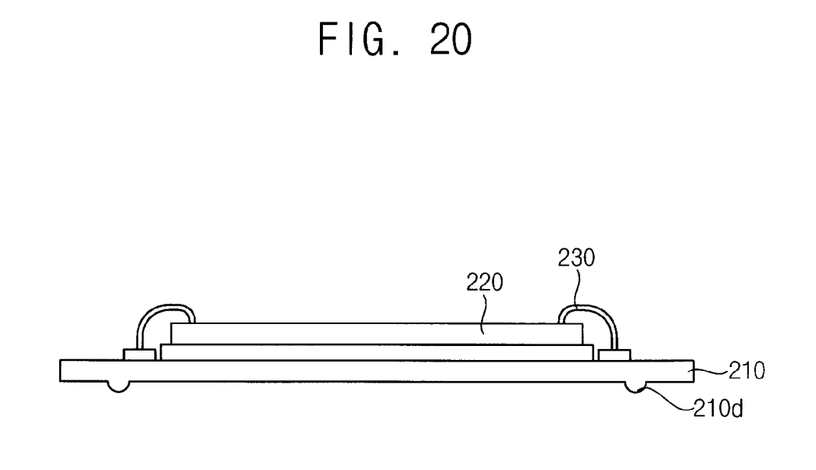

Referring to FIG. 20, the conductive wires 230 may be connected between the pads of the second semiconductor chip 220 and the circuit pattern of the second package substrate 210.

Figure 21:
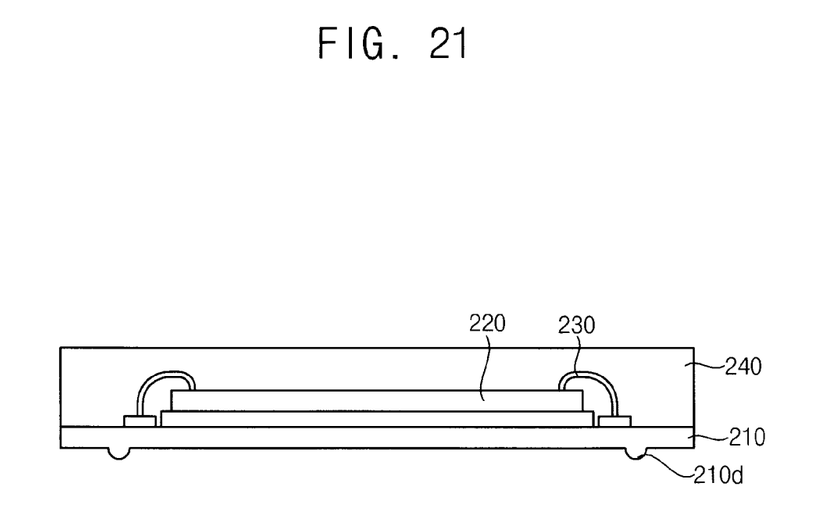

Referring to FIG. 21, the second molding member 240 may be formed on the upper surface of the second package substrate 210 to cover the second semiconductor chip 220 and the conductive wires 230, thereby completing the second semiconductor package 200.

The second semiconductor package 200 may be arranged on the first semiconductor package 100. The upper surface of the first molding member 140 may make contact with the spacers 210d. In contrast, the lower surface of the second package substrate 210 may be positioned so as not to make contact with the plugs 180.

The reflow process may be performed on the plugs 180 and the external terminals 150. The external terminals 150 may be firmly fixed to the lower surface of the first package substrate 110.

When the liquefied plugs 180 are cooled, the solid plugs 180 may be firmly secured to the first package substrate 110 and the second package substrate 210. Thus, the stacked package 300d in FIG. 14 including the first semiconductor package 100 and the second semiconductor package 200 connected with each other via the plugs 180 may be completed.

According to the exemplary embodiments, the spacer may prevent the contact between the plugs and the second semiconductor package. Thus, an electrical short between the plugs may be prevented.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A stacked package comprising:
    a first semiconductor package;
    a second semiconductor package stacked on the first semiconductor package;
    a molding member comprising a plurality of plug holes formed therein, each plug hole comprising a plug configured to electrically connect the first semiconductor package with the second semiconductor package; and
    a plurality of spacers formed on an upper surface of the molding member and configured to prevent an electrical short between the plugs, the spacers interposed between the first semiconductor package and the second semiconductor package and supporting the second semiconductor package to form a gap between the first semiconductor package and the second semiconductor package.

2. The stacked package of claim 1, wherein the spacers are arranged at corners between the first semiconductor package and the second semiconductor package.

3. The stacked package of claim 1, wherein the spacers are configured to individually surround the plugs.

4. The stacked package of claim 1, wherein the spacers have a substantially same thickness.

5. The stacked package of claim 1, wherein each of the spacers has a rounded surface configured to contact with the second semiconductor package.

6. The stacked package of claim 1, wherein each of the spacers have a first surface that contacts the first semiconductor package, and a second surface that contacts the second semiconductor package and has an area smaller than that of the first surface.

7. The stacked package of claim 6, wherein each of the spacers has cross-sectional area that gradually decreases in a direction from the first surface toward to the second surface.

8. The stacked package of claim 1, wherein the spacers are disposed on the first semiconductor package.

9. The stacked package of claim 8, wherein the first semiconductor package comprises:
    a first package substrate;
    a first semiconductor chip disposed on a surface of the first package substrate that faces the second semiconductor package, the first semiconductor chip electrically connected with the first package substrate; and
    a first molding member disposed on the surface of the first package substrate, the first molding member comprising the spacers and plug holes configured to receive the plugs.

10. The stacked package of claim 9, wherein the first semiconductor package further comprises conductive bumps interposed between the first package substrate and the first semiconductor chip to electrically connect the first package substrate with the first semiconductor chip.

11. The stacked package of claim 1, wherein the spacers are provided on the second semiconductor package.

12. The stacked package of claim 11, wherein the second semiconductor package comprises:
    a second package substrate disposed on the first semiconductor package and electrically connected to the plugs, the second package substrate comprising the spacers;
    a second semiconductor chip disposed on a surface of the second package substrate facing away from the first semiconductor package when the second semiconductor package is disposed on the first semiconductor package, the second semiconductor chip electrically connected with the second package substrate; and
    a second molding member disposed on the surface of the second package substrate.

13. The stacked package of claim 1, wherein the spacers are provided on both the first semiconductor package and the second semiconductor package.

14. A method of manufacturing a stacked package, the method comprising:
    preparing a first package substrate;
    arranging plugs on the first package substrate;
    forming a first molding member on a surface of the first package substrate;
    forming spacers on an upper surface of the first molding member; and
    stacking a second semiconductor package on the first package substrate, the second semiconductor package electrically connected with the first package substrate via the plugs, and the spacers interposed between the first package substrate and the second semiconductor package to support the second semiconductor package to form a gap between the first package substrate and the second semiconductor package.

15. The method of claim 14, wherein preparing the first package substrate comprises:
    arranging a first semiconductor chip on the surface of the first package substrate.

16. The method of claim 14, further comprising after forming the first molding member:
    forming plug holes in the first molding member.

17. The method of claim 16, wherein the plug holes are formed by partially removing a surface of the first molding member to expose the plugs using a drill process or an etching process.

18. A stacked package comprising:
    a first semiconductor package;
    a second semiconductor package stacked on the first semiconductor package;
    a molding member comprising a plurality of plug holes formed therein, each plug hole comprising a plug that electrically connects the first semiconductor package and the second semiconductor package; and
    a plurality of spacers formed on an upper surface of the molding member between the first semiconductor package and the second semiconductor package, each of the spacers having a substantially same height,
    wherein the spacers are configured to support the second semiconductor package to permit electrical connection between the first semiconductor package and the second semiconductor package by the plugs and to prevent adjacent plugs from electrically connecting to each other by capillary action, during heating of the stacked package.

19. The stacked package of claim 1, wherein a number of the spacers is less than a number of the plugs.

* * * * *